(12) United States Patent
Cheng et al.

(10) Patent No.: US 9,548,238 B2
(45) Date of Patent: Jan. 17, 2017

(54) METHOD OF MANUFACTURING A SEMICONDUCTOR DEVICE USING A SELF-ALIGNED OPL REPLACEMENT CONTACT AND PATTERNED HSQ AND A SEMICONDUCTOR DEVICE FORMED BY SAME

(71) Applicant: GLOBALFOUNDRIES INC., Grand Cayman (KY)

(72) Inventors: Szu-Lin Cheng, Yorktown Heights, NY (US); Jack O. Chu, Manhasset Hills, NY (US); Isaac Lauer, Yorktown Heights, NY (US); Jeng-Bang Yau, Yorktown Heights, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 42 days.

(21) Appl. No.: 13/964,286

(22) Filed: Aug. 12, 2013

(65) Prior Publication Data

US 2015/0044870 A1    Feb. 12, 2015

(51) Int. Cl.
*H01L 21/768*    (2006.01)

(52) U.S. Cl.
CPC ... *H01L 21/76802* (2013.01); *H01L 21/76808* (2013.01); *H01L 21/76895* (2013.01); *H01L 21/76897* (2013.01); *H01L 2924/0002* (2013.01)

(58) Field of Classification Search
CPC ............ G06F 7/0035; H01L 21/76802; H01L 21/76808; H01L 21/76829; H01L 2221/1031; H01L 21/31144; H01L 21/76801; H01L 21/0274

USPC .................................................. 438/697, 637
See application file for complete search history.

(56) References Cited

U.S. PATENT DOCUMENTS

| | | | | |
|---|---|---|---|---|
| 5,821,164 A | * | 10/1998 | Kim et al. | 438/633 |
| 5,976,966 A | * | 11/1999 | Inoue | 438/618 |
| 6,177,340 B1 | * | 1/2001 | Yoo et al. | 438/637 |

(Continued)

FOREIGN PATENT DOCUMENTS

| | | |
|---|---|---|
| WO | 0243140 A2 | 5/2002 |
| WO | WO 0243140 A2 * | 5/2002 |

OTHER PUBLICATIONS

M. J. Biercuk, D. J. Monsma, C. M. Marcus, J. S. Becker, R. G. Gordon, "A Low-Temperature Atomic Layer Deposition Liftoff Method for Microelectronic and Nanoelectronic Applications", Appl. Phys. Lett. 83, 2405 (2003).*

(Continued)

*Primary Examiner* — Matthew Reames
*Assistant Examiner* — Vincent Wall
(74) *Attorney, Agent, or Firm* — Scully Scott Murphy and Presser; Frank Digiglio

(57) ABSTRACT

A method for manufacturing a semiconductor device, comprises forming an organic planarization layer on a plurality of gates on a substrate, wherein the plurality of gates each include a spacer layer thereon, forming an oxide layer on the organic planarization layer, removing a portion of the oxide layer to expose the organic planarization layer, stripping the organic planarization layer to form a cavity, patterning a direct lithographically-patternable gap dielectric on at least one of the gates in the cavity, and depositing a conductive contact in a remaining portion of the cavity.

16 Claims, 16 Drawing Sheets

(56) References Cited

U.S. PATENT DOCUMENTS

| | | | |
|---|---|---|---|
| 6,528,418 B1* | 3/2003 | Kim | H01L 21/76897 257/E21.507 |
| 6,881,688 B2 | 4/2005 | Maile | |
| 7,297,360 B2 | 11/2007 | Yoshioka et al. | |
| 7,413,990 B2 | 8/2008 | Ye et al. | |
| 7,947,585 B2 | 5/2011 | Baek et al. | |
| 8,063,393 B2 | 11/2011 | Chen | |
| 8,119,531 B1 | 2/2012 | Arnold et al. | |
| 8,137,874 B2* | 3/2012 | Goldfarb et al. | 430/14 |
| 9,082,852 B1* | 7/2015 | Liu | H01L 29/785 |
| 2005/0158981 A1 | 7/2005 | Chang et al. | |

OTHER PUBLICATIONS

Micheal Quirk, Julian Serda, "Semiconductor Manufacturing Technology", 2001, Prentice Hall, 3rd ed., pp. 466-467.*

Vikram Passi, Aurélie Lecestre, Christophe Krzeminski, Guilhem Larrieu, Emmanuel Dubois, Jean-Pierre Raskin, "A single layer hydrogen silsesquioxane (HSQ) based lift-off process for germanium and platinum", Microelectronics Engineering 87, 10 (2009) 1872.*

Hai Q. Chiang, "Development of Oxide Semiconductors: Materials, Devices, and Integration.", presented on Aug. 7, 2007.*

* cited by examiner

100

METHOD OF MANUFACTURING A SEMICONDUCTOR DEVICE USING A SELF-ALIGNED OPL REPLACEMENT CONTACT AND PATTERNED HSQ AND A SEMICONDUCTOR DEVICE FORMED BY SAME

TECHNICAL FIELD

The field generally relates to methods of manufacturing semiconductor devices and, in particular, to methods for manufacturing semiconductor devices using a self-aligned organic planarization layer (OPL) replacement contact and patterned hydrogen silsesquioxane (HSQ).

BACKGROUND

The formation of electrical contacts to electronic and memory devices is a considerable challenge as a consequence of technology scaling, especially as pitch is reduced. In conventional methods for forming self-aligned contacts, formation of the contact area by a dry etching process of an oxide, such as reactive ion etching (RIE), causes unwanted removal of spacer, hard mask and silicide regions. Given recent and anticipated pitch scaling resulting in increasingly smaller pitches between gate structures, it has become increasingly difficult to prevent spacer loss when forming the contact areas. In addition, the difficulty is increased when etching processes have low etch selectivity with respect to the spacers formed along the gate structures (e.g., little or no etch selectivity between contact area oxide and nitride spacer). As a result, there is unwanted spacer, hard mask and silicide loss when forming the contact area vias, resulting in gate to source/drain shorts when the spacer and silicide are removed by the etching process. Moreover, the combination of contact area misalignment and the RIE issues can cause high gate leakage and low yield.

Accordingly, there is a need for a process that is capable of making suitable contacts which are self-aligned to the source and drain, and avoids unwanted shorts.

SUMMARY

In general, exemplary embodiments of the invention include methods of manufacturing semiconductor devices and, in particular, to methods for manufacturing semiconductor devices using a self-aligned organic planarization layer (OPL) replacement contact and patterned hydrogen silsesquioxane (HSQ).

According to an exemplary embodiment of the present invention, a method for manufacturing a semiconductor device, comprises forming an organic planarization layer on a plurality of gates on a substrate, wherein the plurality of gates each include a spacer layer thereon, forming an oxide layer on the organic planarization layer, removing a portion of the oxide layer to expose the organic planarization layer, stripping the organic planarization layer to form a cavity, patterning a direct lithographically-patternable gap dielectric on at least one of the gates in the cavity, and depositing a conductive contact in a remaining portion of the cavity.

According to an exemplary embodiment of the present invention, a semiconductor device, comprises a substrate, a plurality of gates on the substrate, wherein the plurality of gates each include a spacer layer thereon, an oxide layer formed on the substrate and on opposite sides of and spaced apart from the plurality of gates, wherein the plurality of gates are in a cavity defined by the oxide layer, a direct lithographically-patternable gap dielectric patterned on at least one of the gates in the cavity, and a conductive contact in a remaining portion of the cavity.

These and other exemplary embodiments of the invention will be described or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION OF EXEMPLARY EMBODIMENTS

Figure 1:
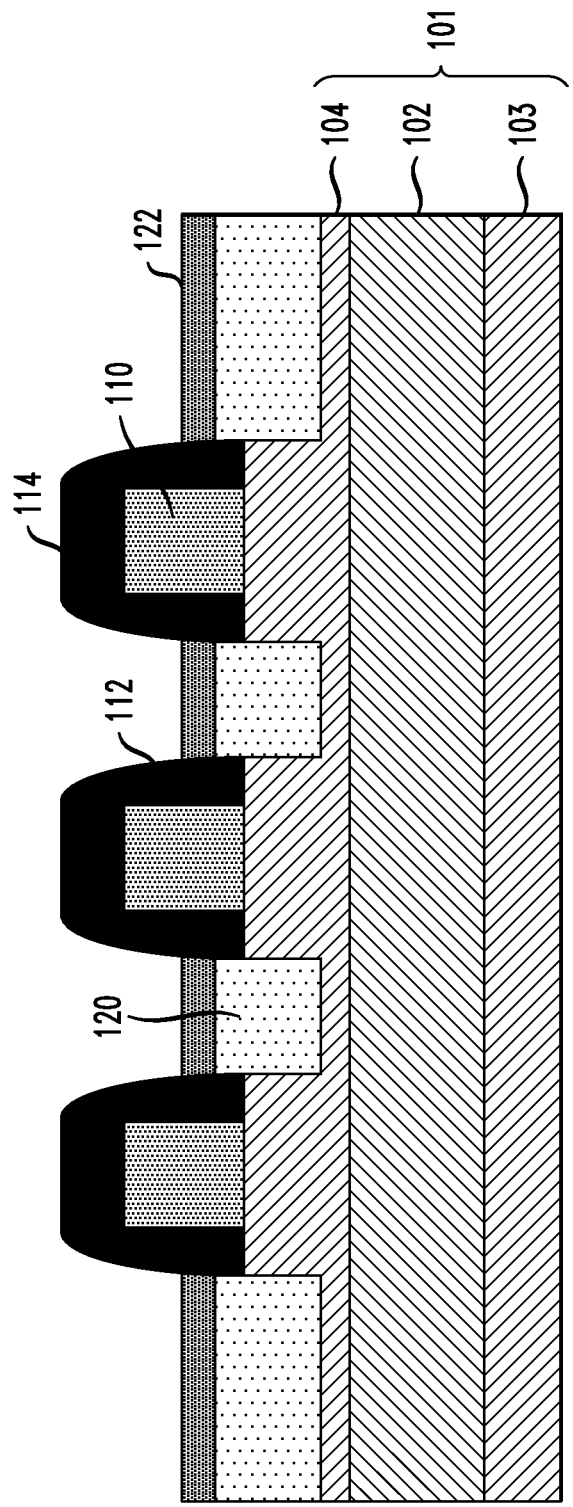
FIG. 1 is a cross-sectional view illustrating a device after silicide formation in a method of manufacturing a semiconductor device, according to an exemplary embodiment of the present invention.

Exemplary embodiments of the invention will now be discussed in further detail with regard to methods of manufacturing semiconductor devices and, in particular, to a method for manufacturing a semiconductor device using a self-aligned organic planarization layer (OPL) replacement contact and patterned hydrogen silsesquioxane (HSQ). This invention may, however, be embodied in many different forms and should not be construed as limited to the embodiments set forth herein.

The embodiments of the present invention include elimination of RIE of a contact area oxide to prevent spacer and silicide loss, which is achieved by replacing the contact area oxide with an organic planarization layer (OPL) at the contact area of interest. In accordance with an embodiment of the present invention, the contact area can be a relaxed quadrilateral shape, such as a square or rectangular shape that covers the device RX area.

The OPL can be removed by, for example, a plasma stripping process, which is harmless to both spacer and silicide regions. After the OPL is removed and the contact area is opened, a direct lithographically-patternable dielectric, such as, for example, hydrogen silsesquioxane (HSQ), is patterned above and around gates for contact isolation. The deposition and patterning processes of the gap dielectric, such as, for example, spin-on coating and electron beam irradiation or optical methods is also harmless to spacer and silicide regions.

The use of the self-aligned OPL replacement region and the direct lithographically-patternable dielectric avoids unwanted material loss during contact formation, and resulting gate to source/drain shorts.

It is to be understood that the various layers and/or regions shown in the accompanying drawings are not drawn to scale, and that one or more layers and/or regions of a type commonly used in semiconductor devices described herein may not be explicitly shown in a given drawing. This does not imply that the layers and/or regions not explicitly shown are omitted from the actual semiconductor devices. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with the embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of the embodiments of the invention provided herein, one of ordinary skill in the art will be able to contemplate other implementations and applications of embodiments of the invention.

Referring to FIG. 1, which is a cross-sectional view illustrating a device 100 after silicide formation in a method of manufacturing a semiconductor device, according to an exemplary embodiment of the present invention, a plurality of gate structures 110 are formed on a substrate 101, such as a semiconductor substrate, and surrounded by spacers 112 and a hard mask layer 114, formed of, for example, a dielectric material including, for example, silicon oxide, silicon nitride, silicon oxynitride, boron nitride, silicon boron nitride or multilayered stacks thereof.

In an embodiment, the substrate 101 is a semiconductor-on-insulator (SOI) substrate. Referring to FIG. 1, the SOI substrate includes a handle substrate 103, a buried insulating layer 102, such as, for example, a buried oxide or nitride layer, located on an upper surface of the handle substrate 103, and a semiconductor layer 104 located on an upper surface of the buried insulating layer 102. In accordance with an embodiment, the semiconductor layer 104 is processed into an active device region such as, for example, a semiconductor fin or a semiconductor nanowire. The handle substrate 103 and the semiconductor layer 104 may comprise the same or different semiconductor material. In addition, multiple layers of the semiconductor materials can be used as the semiconductor material of the handle substrate and the semiconductor layer.

In accordance with another embodiment of the present invention, the substrate 101 is a bulk semiconductor substrate omitting the buried insulating layer and having a semiconductor material including, but not limited to, Si, Ge, SiGe, SiC, SiGeC, InAs, GaAs, InP or other like semiconductor. Multiple layers of these semiconductor materials can also form the bulk semiconductor. In accordance with embodiments of the present invention, the substrate 101 comprises a single crystalline semiconductor material, such as, for example, single crystalline silicon, or a polycrystalline or amorphous semiconductor material.

In accordance with embodiments of the present invention, the gate structures 110 may have a same conductivity (e.g., n- or p-) or different conductivities. Each gate structure 110 can include a gate dielectric layer, a gate conductor layer stacked on the gate dielectric layer, and a hard mask layer (e.g., hard mask layer 114) stacked on the gate conductor layer. The gate dielectric layer can include a dielectric material such as, for example, silicon oxide, silicon nitride, silicon oxynitride, a dielectric metal oxide or any multilayered stack thereof. The gate conductor layer can include a conductive material including, for example, doped polysilicon, a doped silicon germanium alloy, an elemental metal, an alloy containing at least two elemental metals, a metal semiconductor alloy and any multilayered combination thereof.

Referring to FIG. 1, the spacers 112 have a first edge located on a vertical sidewall of each gate structure 110 and a base that is located on the surface of substrate 101. The spacer 112 can include a dielectric insulating material such as, for example, silicon oxide, silicon nitride, silicon oxynitride, boron nitride, silicon boron nitride, or multilayered stacks thereof.

In some embodiments, the spacer 112 can be composed of a same or different material as that of the hard mask layer 114.

In some embodiments of the present disclosure, the pitch of the gate structures 110, i.e., the distance from a central portion of one gate structure to a central portion of an adjacent gate structure, is about 65 nm or less, but is not limited thereto.

Source/Drain regions 120 formed by, for example, epitaxial growth, are positioned between and to the side of the gate structures 110. According to an embodiment, the source/drain regions 120 are recessed in the substrate 101. A silicide layer 122 is formed and patterned on the source/drain regions 120.

It is to be understood that embodiments of the present invention are applicable to various semiconductor devices, including, but not limited to, planar (as shown), fin field-effect transistor (FinFET) and gate all-around FET (nanowire) devices.

Figure 2:
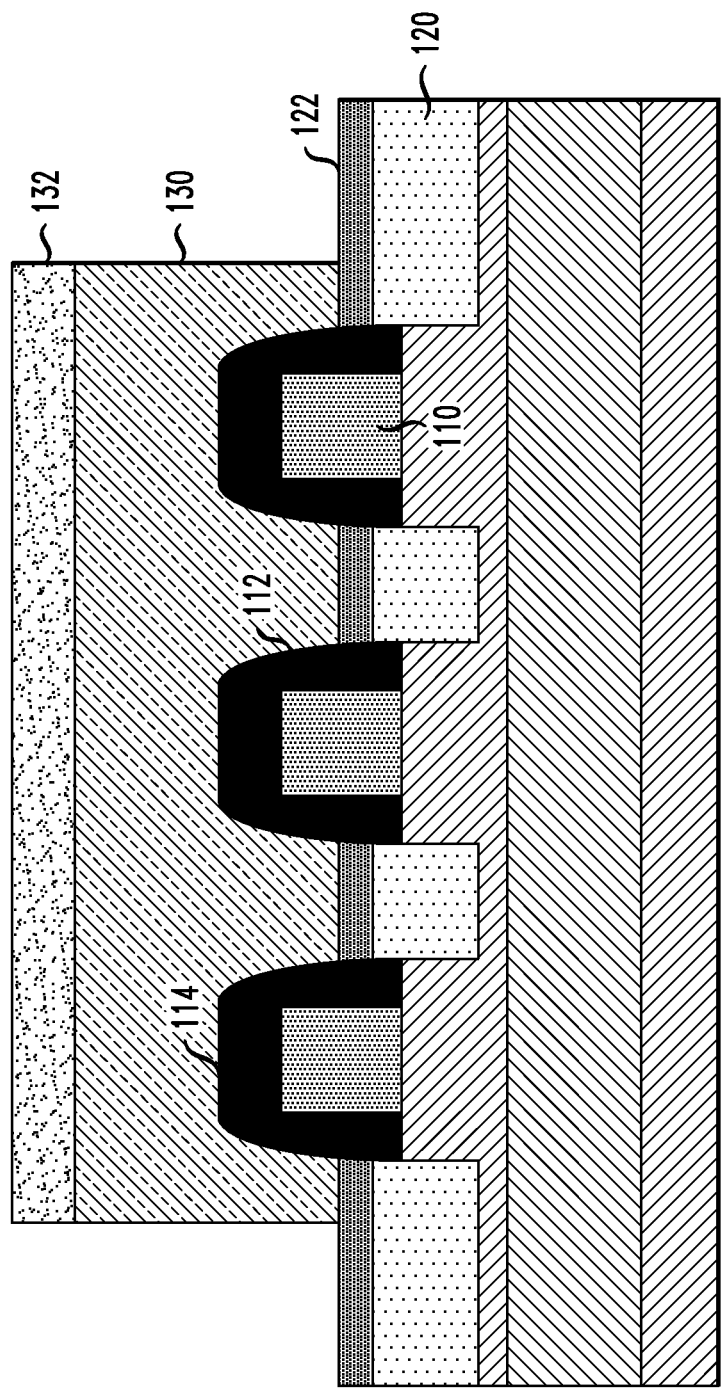
FIG. 2 is a cross-sectional view illustrating formation of an organic planarization layer (OPL) and hard mask in a method of manufacturing a semiconductor device, according to an exemplary embodiment of the invention.

Referring to FIG. 2, an organic planarization layer (OPL) 130 is formed and patterned on the silicide layer 122, spacers 112 and hard mask 114. In accordance with an embodiment of the present invention, the OPL material may be an organic polymer including C, H, and N. The OPL material is capable of generating etch residues during a reactive ion etch process that is re-deposited on unetched portions of the OPL. In an embodiment, the OPL material can be free of fluorine (F). In another embodiment, the OPL material can be free of silicon (Si). As defined herein, a material is free of an atomic element when the level of the atomic element in the material is at or below a trace level detectable with analytic methods available in the art. In another embodiment, the OPL material may be free of Si and F. Non-limiting examples of the OPL material include JSR HM8006, JSR HM8014, AZ UM10M2, Shin Etsu ODL 102, or other similar commercially available materials from such vendors as JSR, TOK, Sumitomo, Rohm & Haas, etc. The OPL material can be deposited, for example, by spin coating. A hard mask 132, for example, silicon oxide or silicon nitride, is formed on the OPL 130. In accordance with an embodiment, after deposition, using, for example, a spin-coating method, the OPL 130 and hard mask 132 are patterned with a full resist using for example, etching, to result in the structure shown in FIG. 2. According to an embodiment, a top surface of the OPL 130 is a predetermined distance above the gate structure 110, for example, about 5 nm to about 100 nm above the gate structure 110, and more specifically, about 20 nm to about 40 nm.

Figure 3:
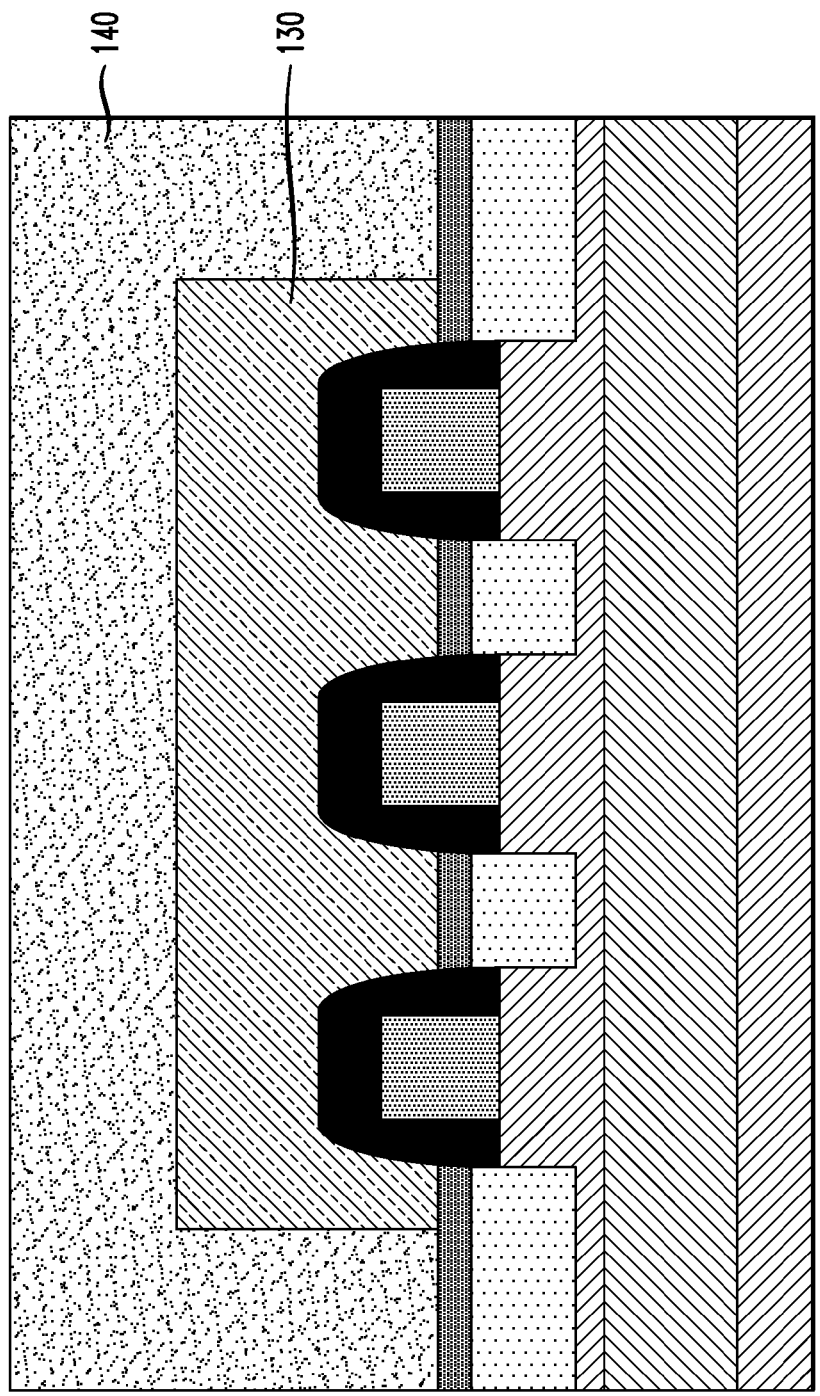
FIG. 3 is a cross-sectional view illustrating deposition and planarization of a first level metallization oxide in a method of manufacturing a semiconductor device, according to an exemplary embodiment of the invention.

Referring to FIG. 3, a first level metallization (M1) oxide 140 (which is actually a middle of the line and M1 oxide as will be explained in connection with FIGS. 8 and 15, but is called an M1 oxide for the sake of brevity) is deposited and planarized on the OPL 130 after removal of the hard mask 132 in a method of manufacturing a semiconductor device, according to an exemplary embodiment of the invention. Planarization of the M1 oxide 140 can be performed by a process such as chemical mechanical planarization (CMP). The M1 oxide 140 can be deposited using, for example, high density plasma (HDP) deposition, such as HDP-chemical vapor deposition (CVD), and can be an oxide, such as, for example, silicon oxide, PECVD $SiO_2$, SiCOH based oxide, or any other dielectric which shows selectivity to the stripping process for the OPL 130.

Figure 4:
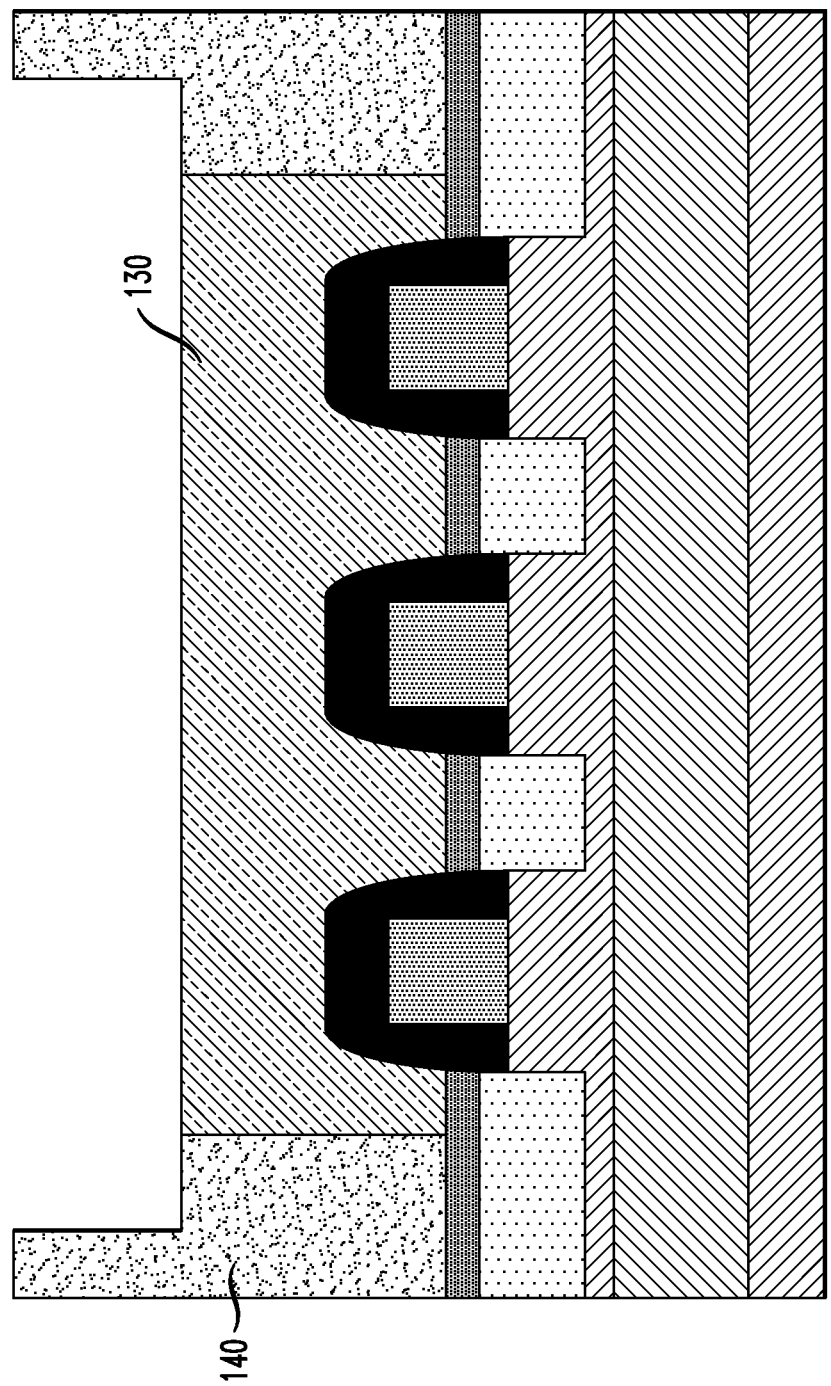
FIG. 4 is a cross-sectional view illustrating first level metallization oxide lithography and reactive ion etching (RIE) in a method of manufacturing a semiconductor device, according to an exemplary embodiment of the invention.
Figure 5:
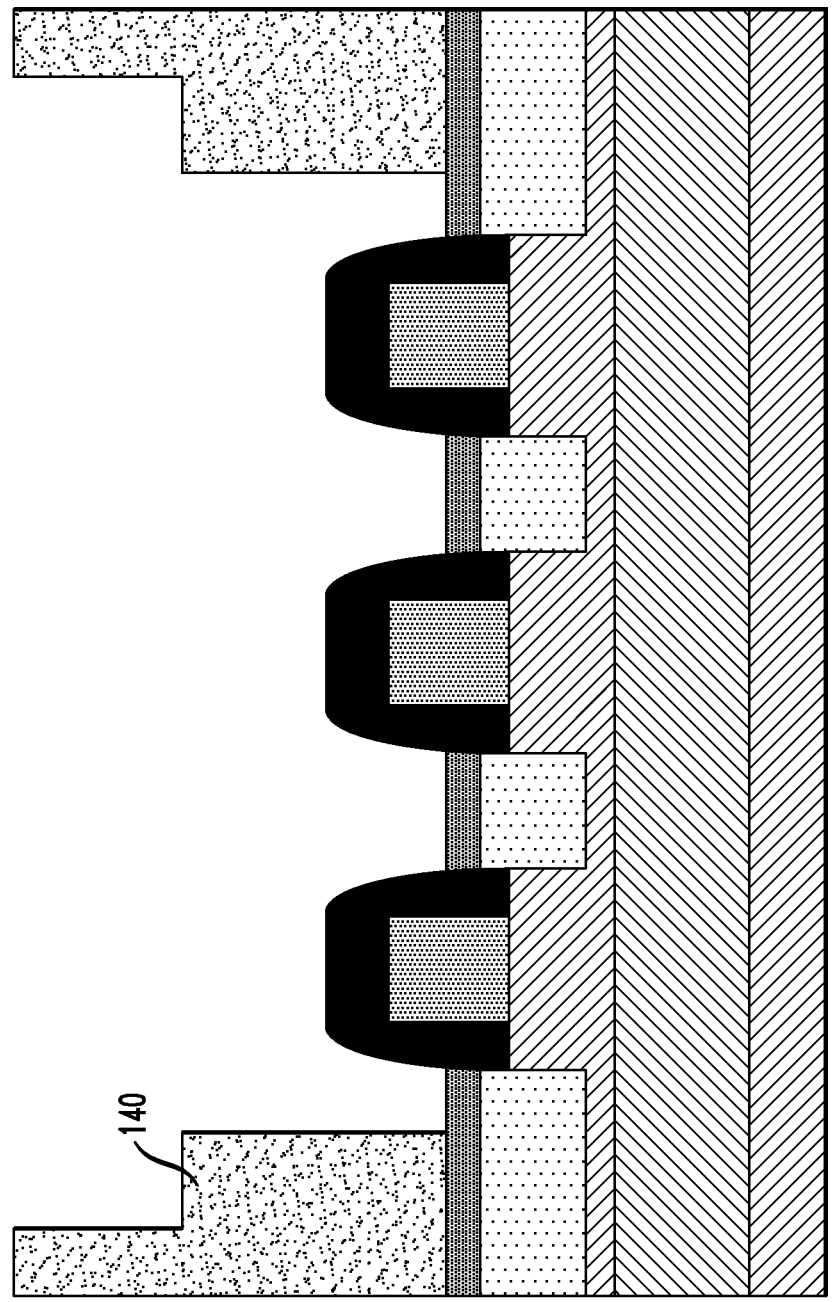
FIG. 5 is a cross-sectional view illustrating stripping of an organic planarization layer (OPL) in a method of manufacturing a semiconductor device, according to an exemplary embodiment of the invention.

Referring to FIG. 4, lithography and reactive ion etching are performed on the M1 oxide 140 to open up an area where an M1 metal can be deposited. According to an embodiment, etching of a portion of the M1 oxide 140 is performed to expose the OPL 130. Referring to FIG. 5, the exposed OPL 130 is stripped using, for example, oxygen plasma, nitrogen plasma, hydrogen plasma or other carbon strip process. OPL stripping causes minimal or no damage to the spacers 112 or the silicide layer 122.

Figure 6:
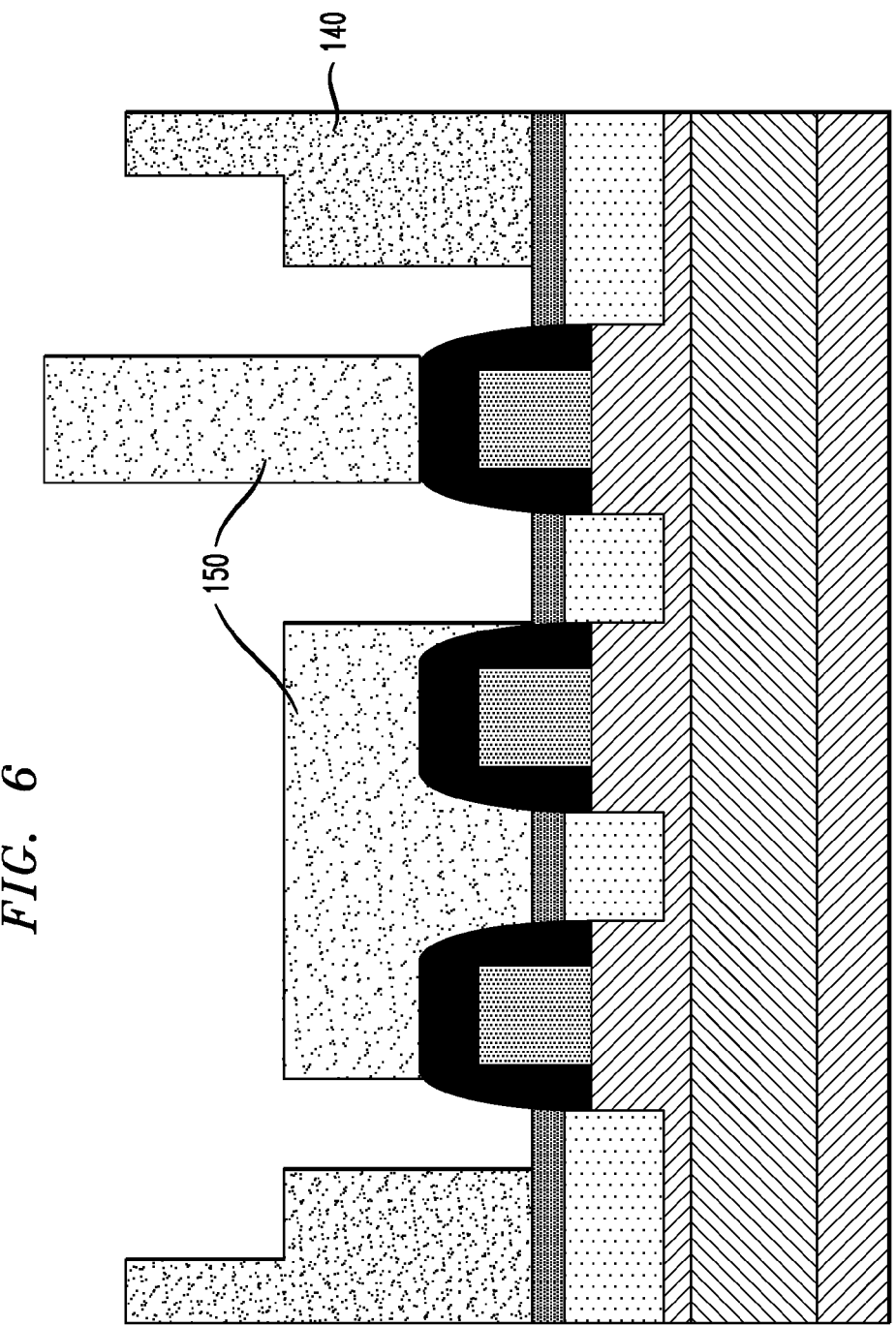
FIG. 6 is a cross-sectional view showing formation of a gap dielectric in a method of manufacturing a semiconductor device, according to an exemplary embodiment of the invention.

Referring to FIG. 6, a gap dielectric 150, for example, a direct lithographically-patternable dielectric, such as hydrogen silsesquioxane (HSQ) gap dielectric is deposited and patterned. A spin-on coating, dip coating, brush coating, blade coating, chemical solution deposition, and ink-jet dispensing, and electron-beam irradiation or optical methods can be used to deposit and directly pattern the dielectric 150.

In accordance with an embodiment, the dielectric 150 can be patterned by subjecting the dielectric to a pattern-wise exposure step that forms latent images of a desired pattern. The desired pattern may be in a variety of shapes, including but not limited to, cylindrical, square and rectangular. In some embodiments, an optional post-exposure baking may be performed to effect the photochemical reactions. When performed, the optional post-exposure baking can be conducted at a temperature from 60° C. to 200° C. After exposure and post-exposure baking, the latent images are developed directly into the direct lithographically-patternable dielectric 150 with an appropriate developer, for example, an aqueous base solution, such as 0.26N tetramethylammoniahydroxide (TMAH) solution, to form the structures having the desired pattern.

In accordance with an embodiment of the present invention, the pattern wise exposing process can be accomplished in a variety of ways, including, for example, through a mask with a lithography stepper or a scanner with an exposure light source of G-line, M-line (365 nm), DUV (248 nm, 193 nm, 157 mm, 126 nm), Extreme UV (13.4 nm), and electron beam, or an ion beam. The exposing process may be performed in a dry mode or an immersion mode. The pattern-wise exposing process also includes direct writing without the use of a mask with, for example, light, electron beam, ion beam, and scanning probe lithography. Other patterning techniques that can be used include contact printing techniques such as nanoimprint lithography, embroising, micro contact printing, replica molding, microtransfer molding, micromolding in capillaries and solvent-assisted micromolding, thermal assisted embroising, inject printing, and the like.

As shown, the dielectric 150 is patterned over and/or between the gate structures 110. The height of the dielectric 150 over the gate structures 110 can be controlled by altering the spin rate or the chemical composition during the spin-on process. For example, the gate to the right of FIG. 6 has a taller dielectric layer than the gates to the left of FIG. 6 so as to control connectivity to or isolate the gates at the metallization level according to design constraints.

Figure 7:
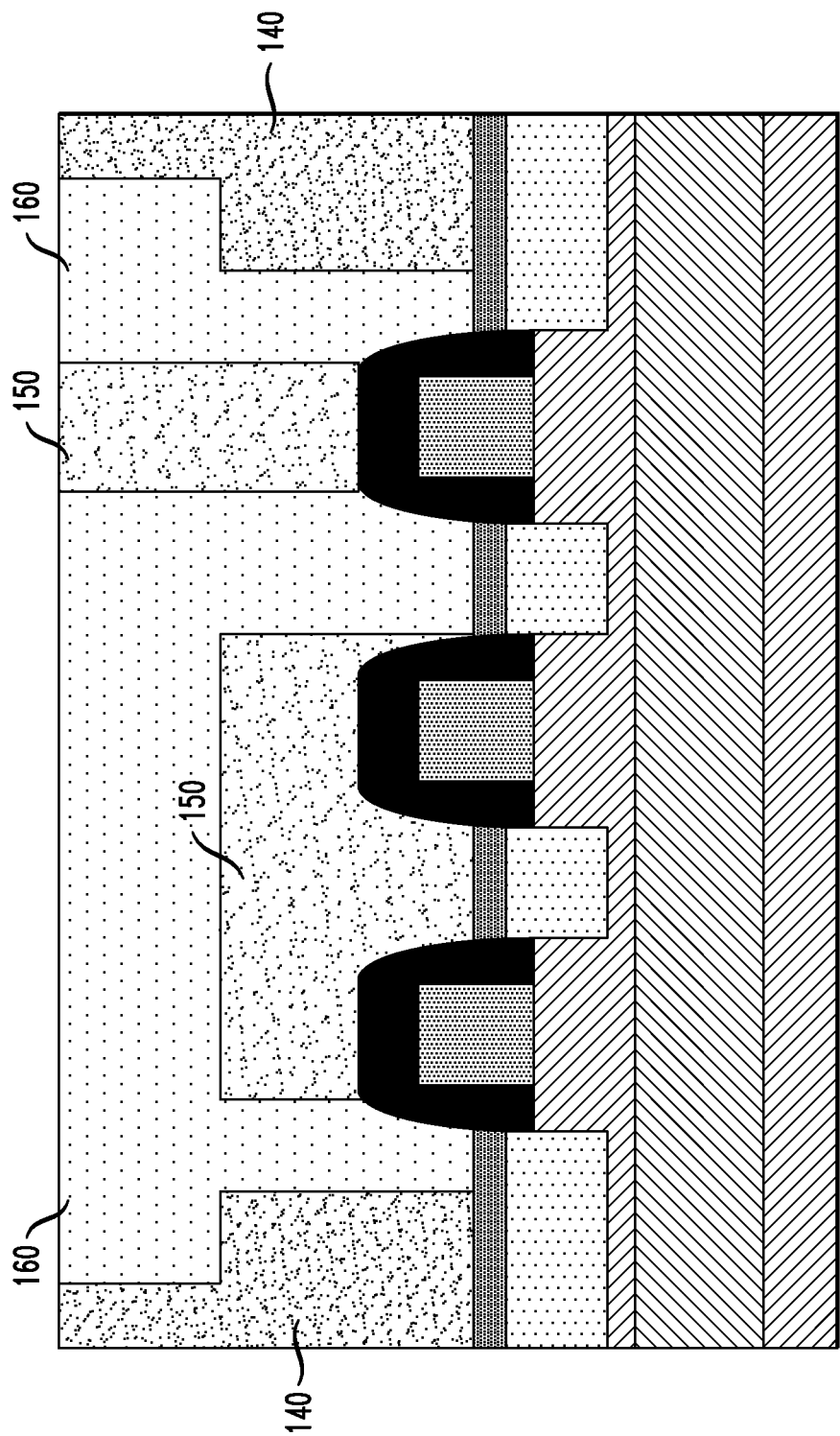
FIG. 7 is a cross-sectional view illustrating deposition of a conductor by a dual damascene process in a method of manufacturing a semiconductor device, according to an exemplary embodiment of the invention.

Referring to FIG. 7, an M1 conductor 160, such as, for example, copper, is deposited by a dual damascene process and planarized in a method of manufacturing a semiconductor device, according to an exemplary embodiment of the invention. As can be seen, the M1 conductor 160 is deposited in the spaces between the portions of the gap dielectric 150 and between the gap dielectric 150 and the M1 oxide 140. Planarization is performed using, for example, CMP.

Figure 8:
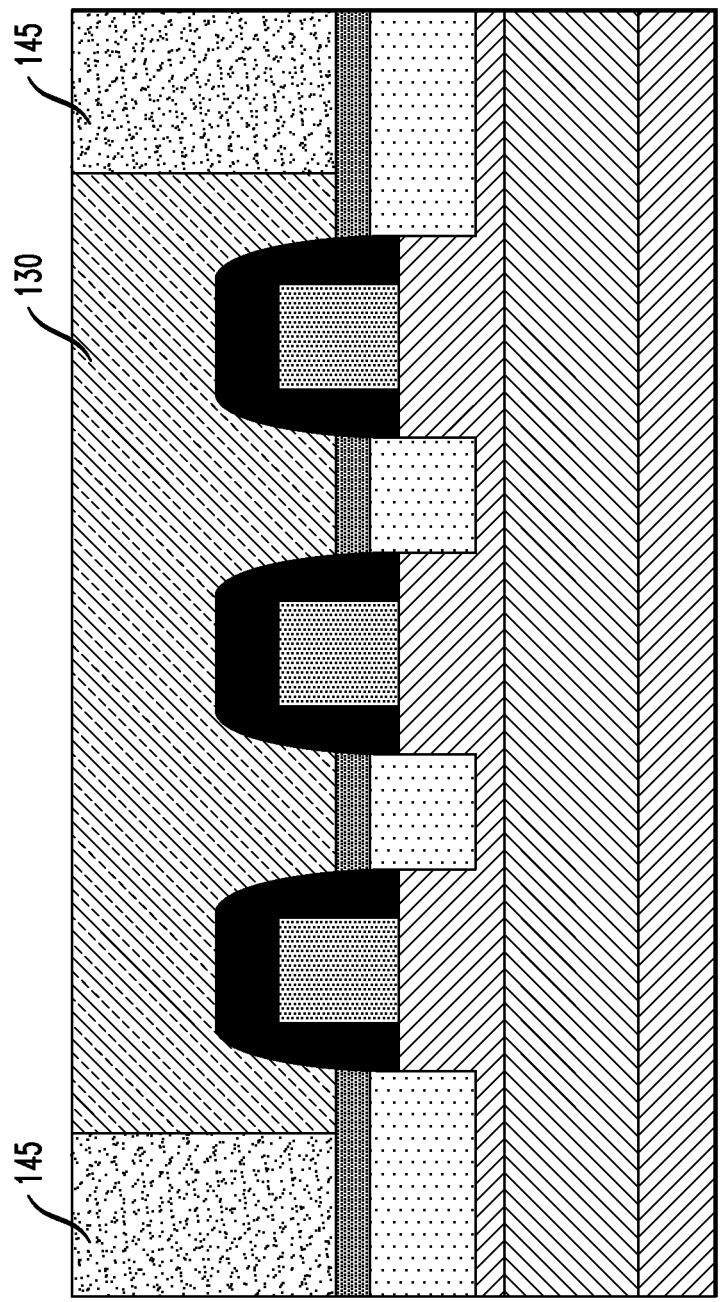
FIG. 8 is a cross-sectional view showing deposition and planarization of a middle of the line contact area oxide in a method of manufacturing a semiconductor device, according to another exemplary embodiment of the invention.

Referring to FIG. 8, in accordance with another embodiment of the present invention, a middle of the line contact area oxide 145 is deposited and planarized by a process such as chemical mechanical planarization (CMP) to be level with the OPL 130. In accordance with an embodiment, the middle of the line contact area oxide can also be etched back in combination with CMP to level the middle of the line contact area oxide 145 and expose the OPL 130. The middle of the line contact area oxide 145 can be deposited using, for example, plasma enhanced chemical vapor deposition (PECVD) or flowable (F)-CVD, and can be an oxide, such as, for example, silicon oxide, PECVD SiO2, SiCOH based oxide, or any other dielectric which shows selectivity to the stripping process for the OPL 130. Unlike the situation shown in FIG. 4, which leaves a portion of the deposited oxide above the OPL 130 to function as the M1 oxide (i.e., forming middle of the line and M1 oxide together), the embodiment in FIG. 8 forms the middle of the line contact area oxide 145 without forming the M1 oxide, and leaves formation of the M1 oxide for a subsequent step.

Figure 9:
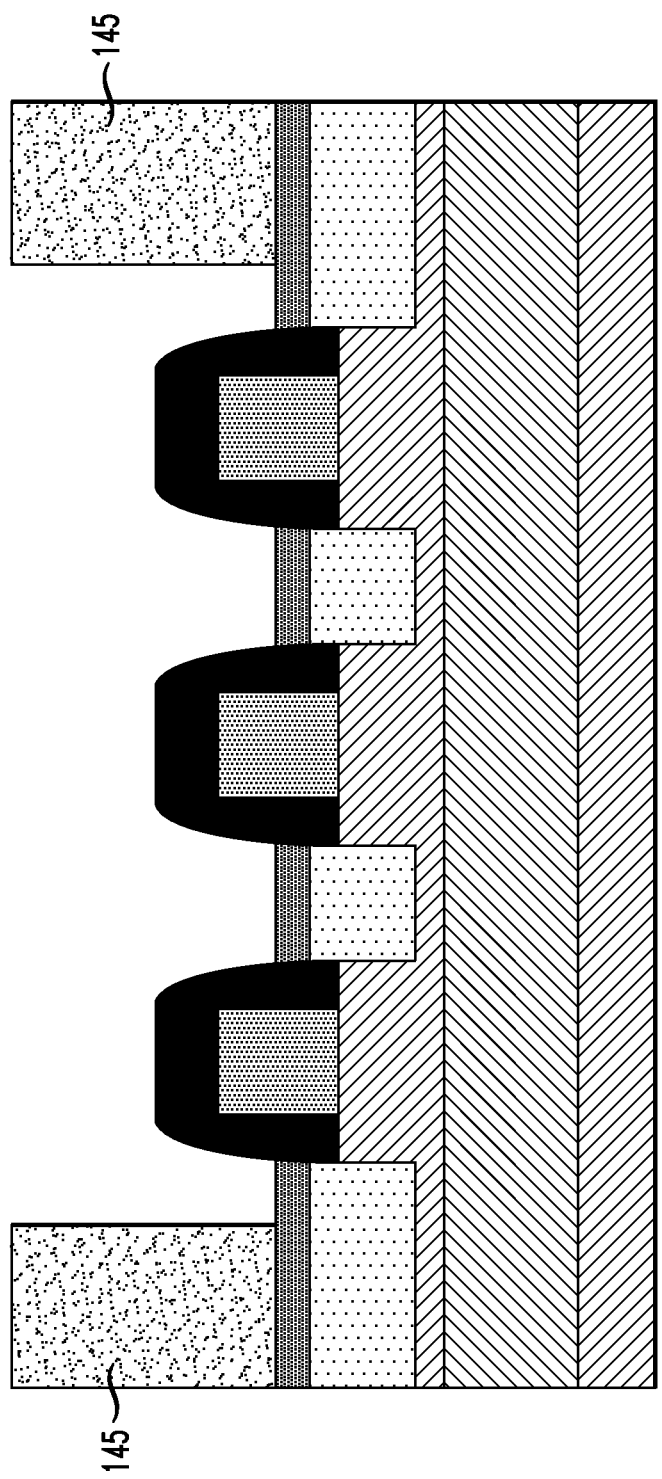
FIG. 9 is a cross-sectional view illustrating stripping of an organic planarization layer (OPL) in a method of manufacturing a semiconductor device, according to another exemplary embodiment of the invention.

Then, referring to FIG. 9, like FIG. 5, the exposed OPL 130 is stripped using, for example, oxygen plasma, nitrogen plasma, hydrogen plasma or other carbon strip process. OPL stripping causes minimal or no damage to the spacers 112 or the suicide layer 122.

Figure 10:
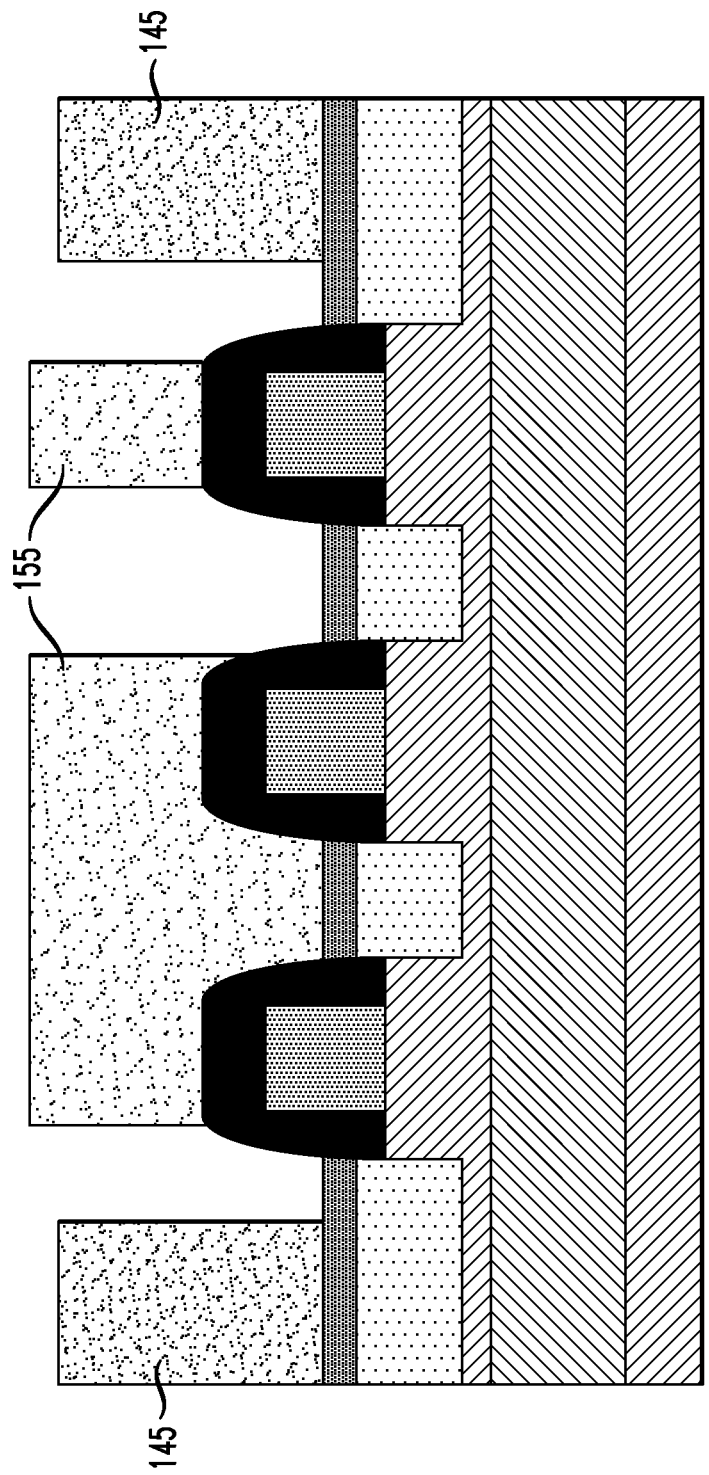
FIG. 10 is a cross-sectional view showing formation of a gap dielectric in a method of manufacturing a semiconductor device, according to another exemplary embodiment of the invention.

Referring to FIG. 10, similar to FIG. 6, a gap dielectric 155, for example, a direct lithographically-patternable dielectric, such as hydrogen silsesquioxane (HSQ) gap dielectric is deposited and patterned. A spin-on coating and electron-beam irradiation or optical methods can be used to deposit and directly pattern the dielectric 155. As shown, the dielectric 155 is patterned over and/or between the gate structures 110. Unlike what is shown in FIG. 6, the height of the dielectric 155 over the gate structures 110 is controlled to be level with the height of the middle of the line oxide 145.

Figure 11:
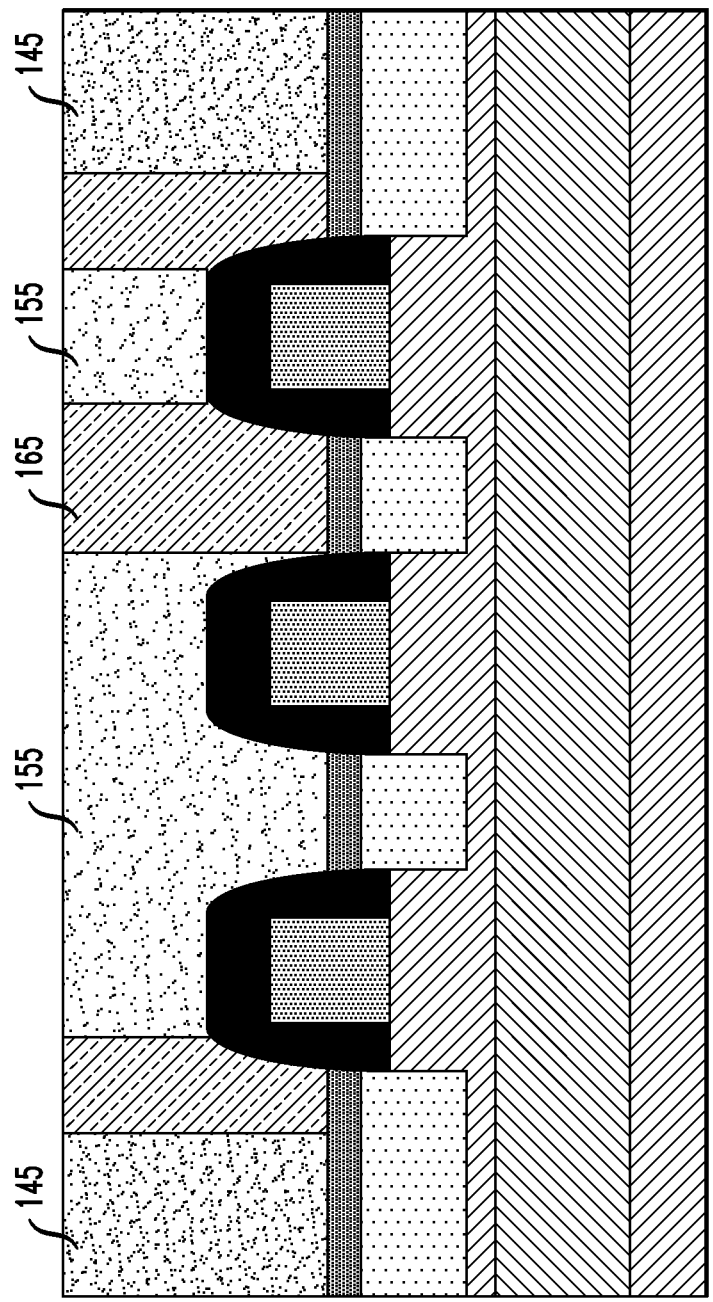
FIG. 11 is a cross-sectional view showing deposition and planarization of a middle of the line conductor in a method of manufacturing a semiconductor device, according to another exemplary embodiment of the invention.

Referring to FIG. 11, a middle of the line conductor 165, such as, for example, tungsten (W), is deposited and planarized. As can be seen, the middle of the line conductor 165 is deposited in the spaces between the portions of the gap dielectric 155 and between the gap dielectric 155 and the middle of the line oxide 145. Planarization is performed using, for example, CMP.

Figure 12:
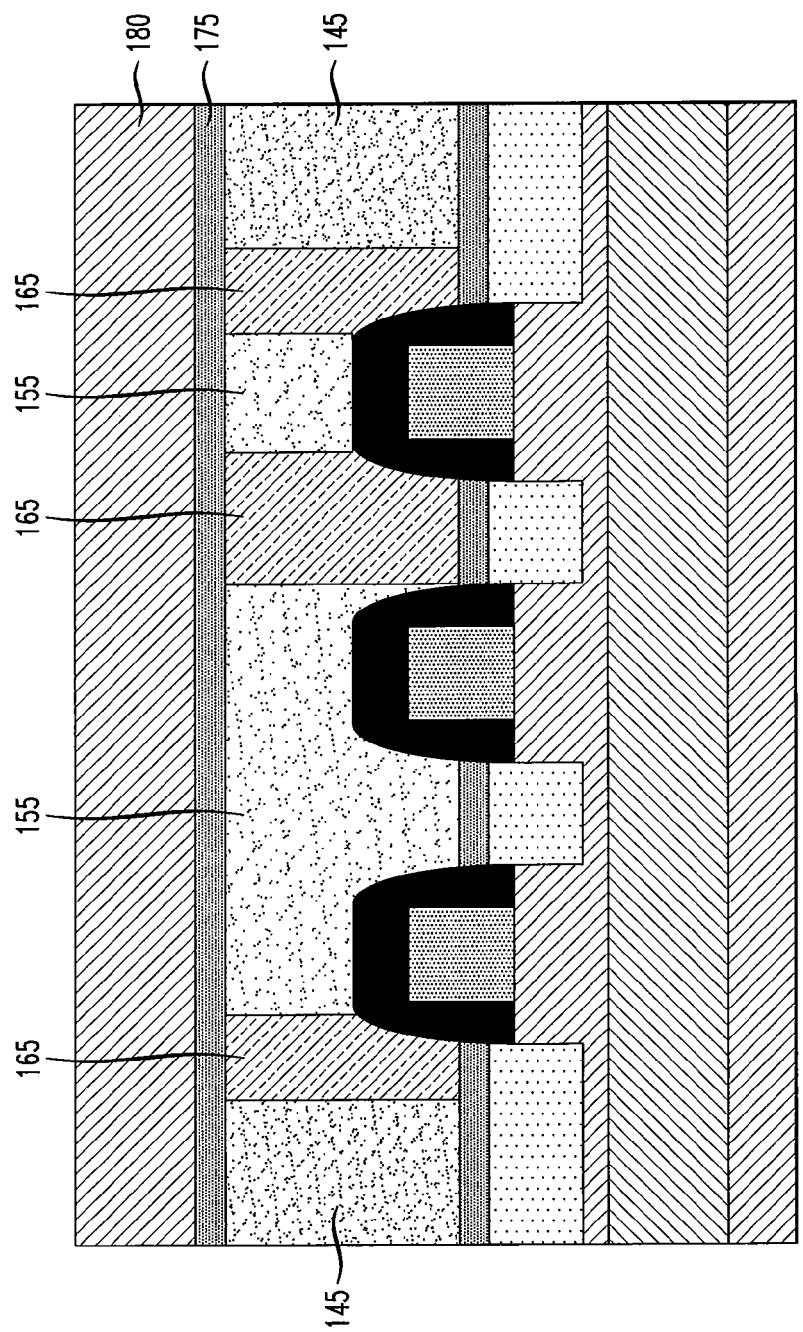
FIG. 12 is a cross-sectional view showing deposition of an interlayer dielectric and a first level metallization oxide in a method of manufacturing a semiconductor device, according to another exemplary embodiment of the invention.
Figure 13:
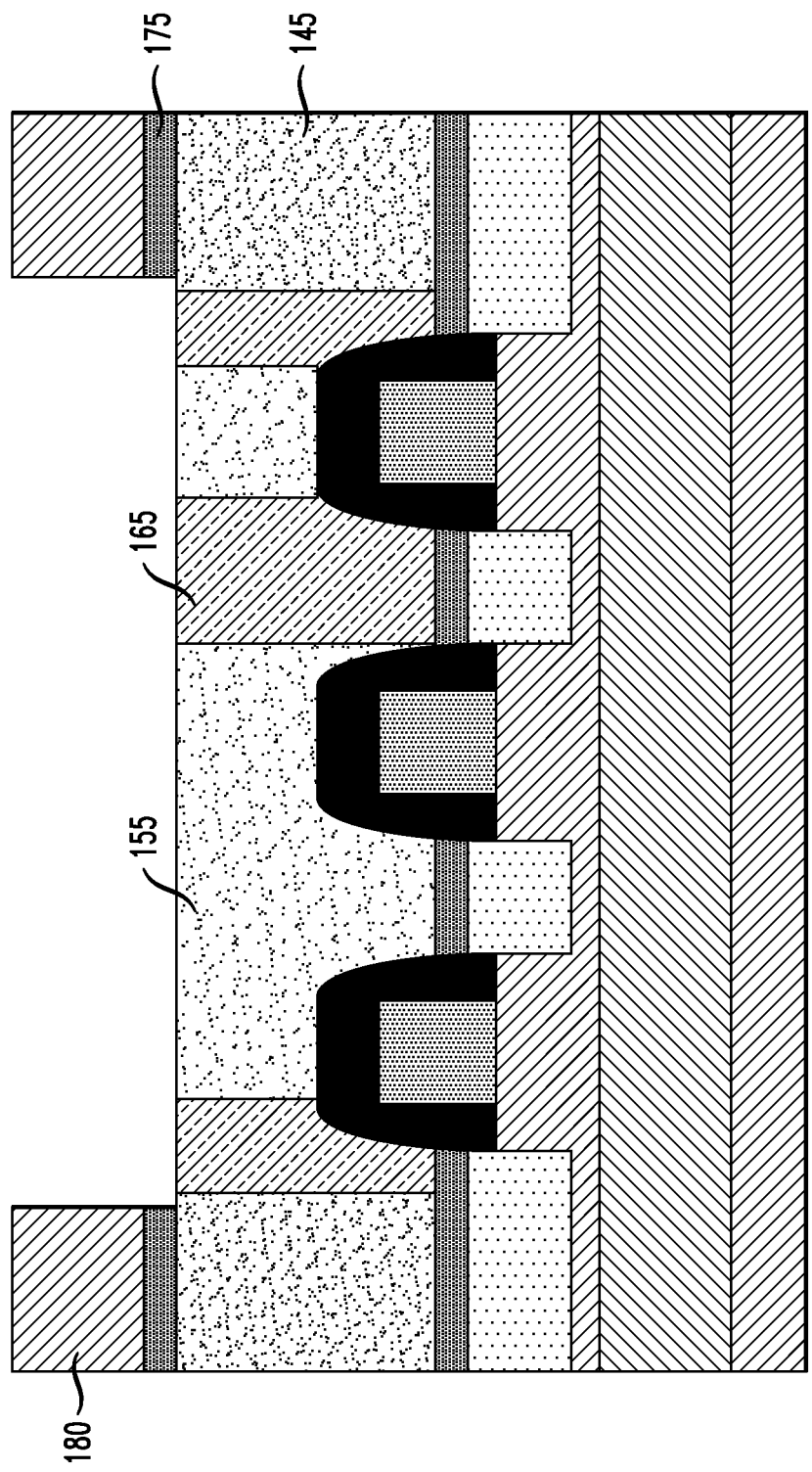
FIG. 13 is a cross-sectional view illustrating first level metallization oxide and interlayer dielectric lithography and reactive ion etching (RIE) in a method of manufacturing a semiconductor device, according to another exemplary embodiment of the invention.

Referring to FIG. 12, an interlayer dielectric 175, for example, a nitride deposited by PECVD, is deposited on the middle of the line structure including the oxide 145, gap dielectric 155 and conductor 165, and an M1 oxide 180 is deposited on the interlayer dielectric 175. The M1 oxide 180 can be, for example, a PECVD or flowable (F)-CVD oxide. Then, referring to FIG. 13, lithography and reactive ion etching are performed on the M1 oxide 180 and interlayer dielectric 175 to expose the middle of the line structure and open up an area where an M1 metal can be deposited.

Figure 14:
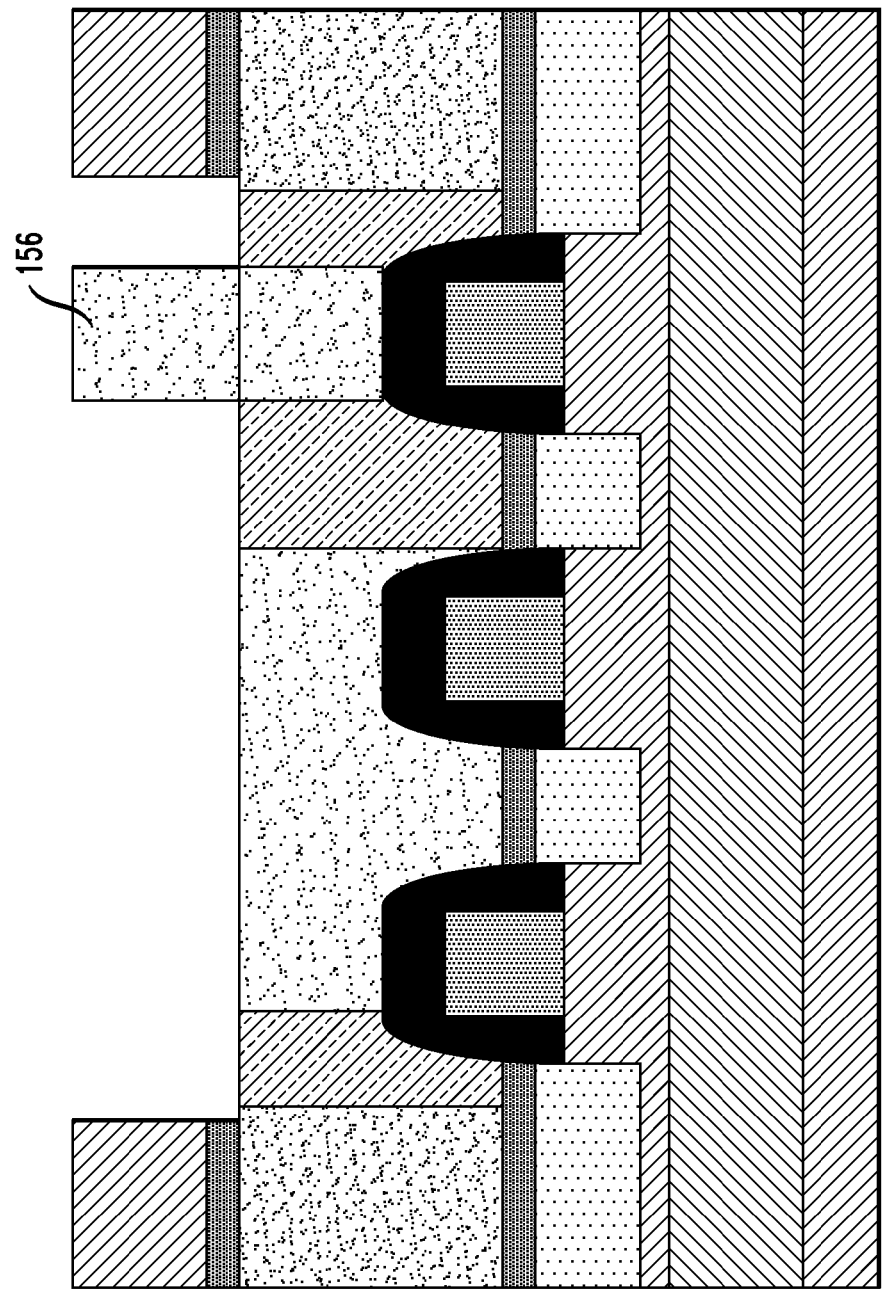
FIG. 14 is a cross-sectional view formation of a gap dielectric in a method of manufacturing a semiconductor device, according to another exemplary embodiment of the invention.

Referring to FIG. 14, a gap dielectric 156, for example, a direct lithographically-patternable dielectric, such as hydrogen silsesquioxane (HSQ) gap dielectric like the dielectrics 150 and 155, is deposited and patterned. As with the dielectrics 150 and 155, spin-on coating and electron-beam irradiation or optical methods can be used to deposit and directly pattern the dielectric 156. As shown, the dielectric 156 is formed so that the gate to the right of FIG. 14, like the gate to the right in FIG. 6, has a taller dielectric layer than the gates to the left of FIG. 14 so as to enable connectivity of the gates to the left and isolate the gate to the right in the M1 metallization level according to design constraints.

Figure 15:
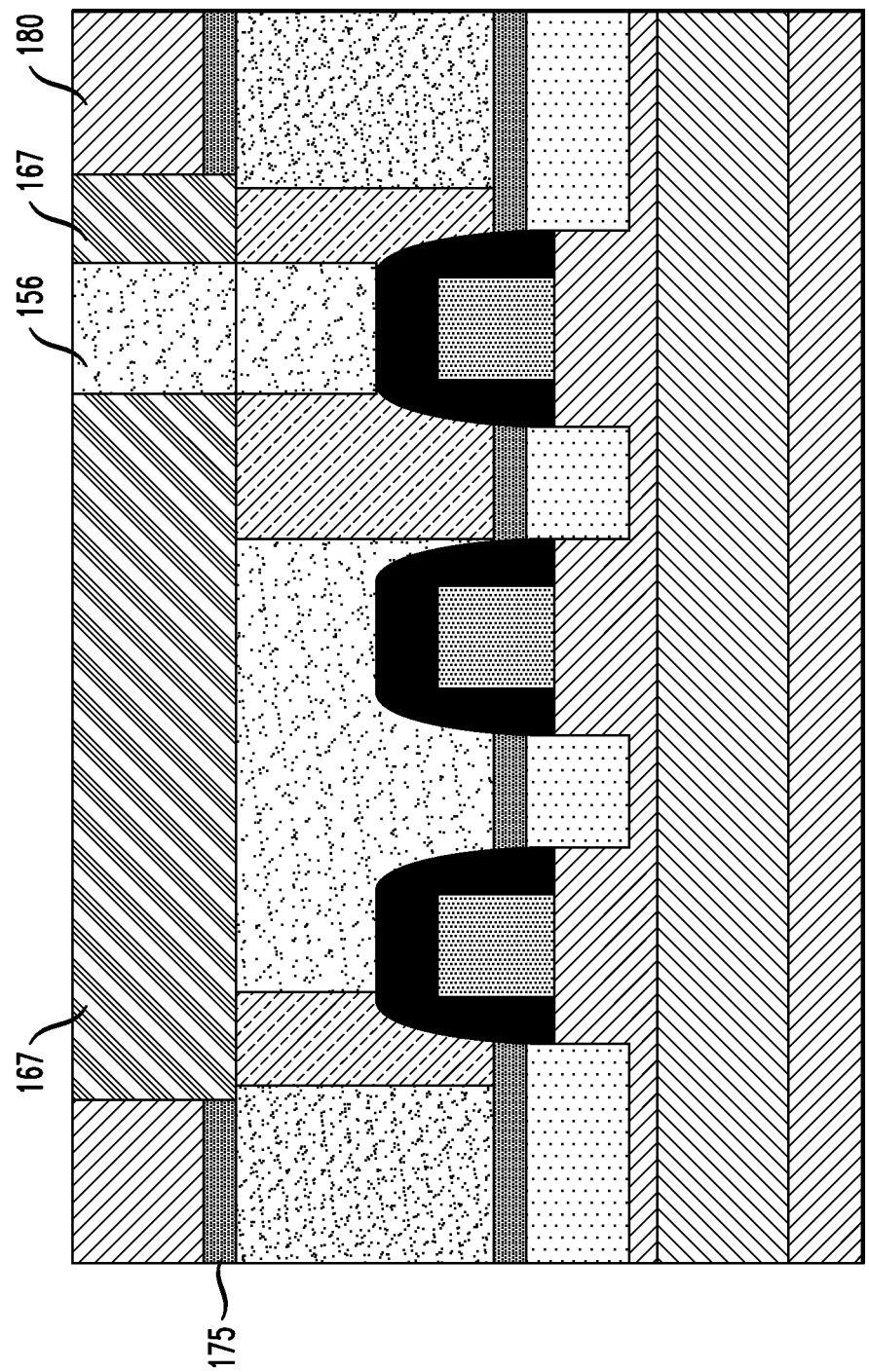
FIG. 15 is a cross-sectional view illustrating deposition of a conductor by a dual damascene process in a method of manufacturing a semiconductor device, according to another exemplary embodiment of the invention.
Figure 16:
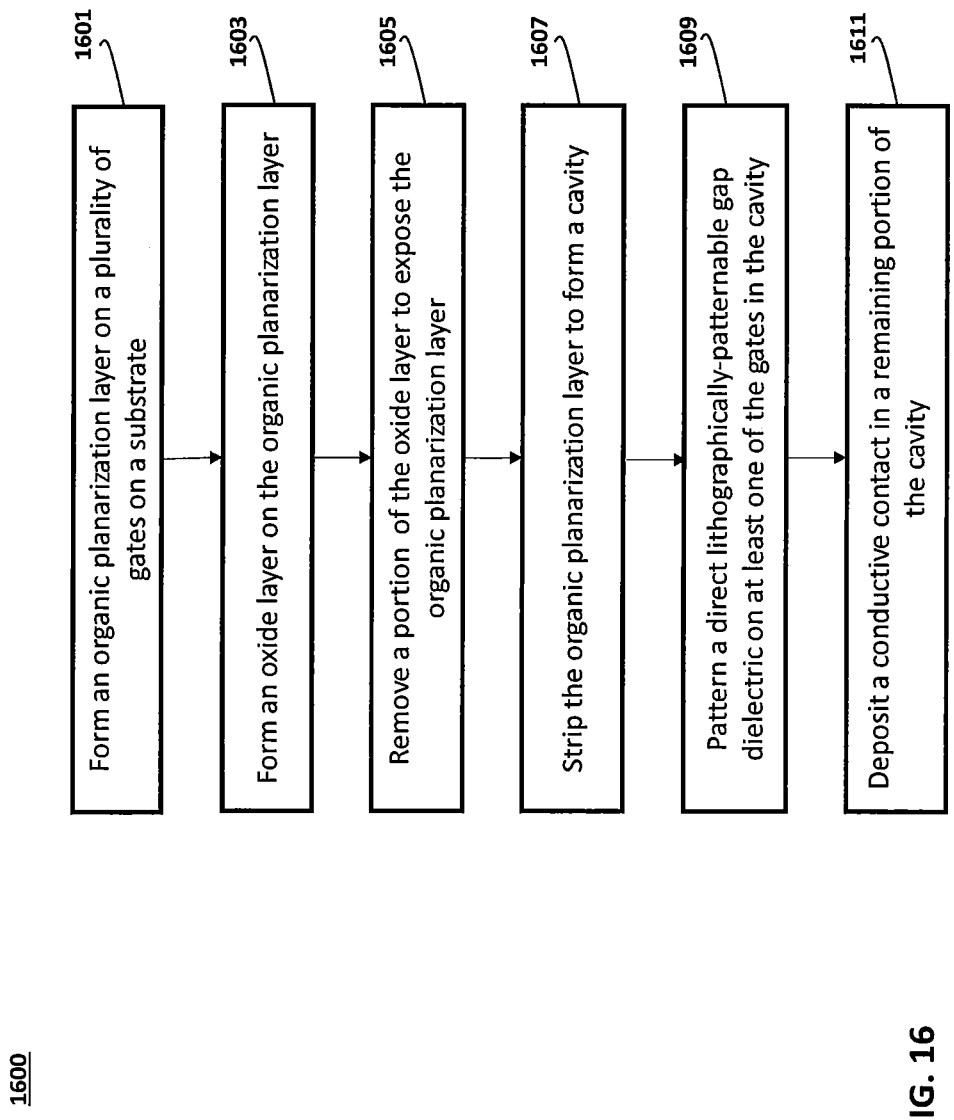
FIG. 16 is a flow diagram illustrating a method of manufacturing a semiconductor device, according to an exemplary embodiment of the present invention.

Referring to FIG. 15, an M1 conductor 167, such as, for example, copper, is deposited by a dual damascene process and planarized in a method of manufacturing a semiconductor device, according to an exemplary embodiment of the invention. As can be seen, the M1 conductor 167 is deposited on the middle of the line structure in the spaces between the gap dielectric 156 and the M1 oxide 180. Planarization is performed using, for example, CMP. In FIGS. 8-15, as can be seen, the middle of line conductor 165 can differ from the M1 conductor 167. According to an alternative embodiment, the processes described in connection with FIGS. 13-15 can be substituted with conventional M1 contact area formation, where a direct lithographically-patternable gap dielectric is not used, and contact area vias are formed in the M1 oxide 180 using etching methods, such as, for example RIE, and a conductor is deposited in the vias.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor device, the method comprising:
   forming an organic planarization layer on top and side surfaces of a plurality of gates on a substrate, wherein the plurality of gates each include a spacer layer thereon, and the organic planarization layer comprises top and side surfaces;
   forming a contact area oxide layer on the top and side surfaces of the organic planarization layer, wherein the contact area oxide comprises top and side surfaces;
   removing a portion of the contact area oxide layer to expose the top surface of the organic planarization layer, wherein the organic planarization layer covers the plurality of gates so that the plurality of gates remains unexposed during the removing of the portion of the contact area oxide layer;
   stripping the entire organic planarization layer to form a cavity over the top and side surfaces of the plurality of gates and between the side surfaces of the contact oxide layer;
   patterning a direct lithographically-patternable gap dielectric on at least one of the gates in the cavity after the removing and stripping steps; and
   depositing a conductive contact in a remaining portion of the cavity, wherein the depositing of the conductive contact in the remaining portion of the cavity is performed without any prior removal of the patterned direct lithographically-patternable gap dielectric.

2. The method according to claim 1, wherein the direct lithographically-patternable gap dielectric comprises hydrogen silsesquioxane (HSQ).

3. The method according to claim 1, wherein stripping the organic planarization layer is performed with at least one of oxygen plasma, nitrogen plasma or hydrogen plasma.

4. The method according to claim 1, wherein the organic planarization layer is formed to height of greater than about 5 nm above the gates.

5. The method according to claim 1, wherein removing the portion of the contact area oxide layer comprises lithography and etching to leave portions of the oxide layer at varying heights.

6. The method according to claim 5, wherein a first portion of the contact area oxide layer at a first height corresponds to a middle of the line contact areaand a second portion of the contact area oxide layer at a second height corresponds to a metallization level contact area.

7. The method according to claim 1, wherein the direct lithographically-patternable gap dielectric is patterned on more than one gate and to different heights on at least two gates.

8. The method according to claim 7, wherein the conductive contact fills in a space in the cavity between adjacent gates including the direct lithographically-patternable gap dielectric on each gate.

9. The method according to claim 1, wherein a top surface of the contact area oxide layer is level with a top surface of the organic planarization layer after removal of the portion of the contact area oxide layer.

10. The method according to claim 9, wherein the direct lithographically-patternable gap dielectric is patterned on more than one gate and to a same height as the contact area oxide layer.

11. The method according to claim 10, wherein the conductive contact fills in a space in the cavity between adjacent gates including the direct lithographically-patternable gap dielectric on each gate.

12. The method according to claim 1, wherein the organic planarization layer includes an organic polymer.

13. The method according to claim 1, wherein the organic planarization layer is free of silicon.

14. The method according to claim 1, wherein an entire top surface of the organic planarization layer is exposed to remove the entire organic planarization layer as a result of the stripping process.

15. The method according to claim 1, wherein the direct lithographically-patternable gap dielectric is selectively deposited over the at least one of the gates leaving portions of the cavity formed by the stripping unfilled.

16. A method for manufacturing a semiconductor device, the method comprising:

forming an organic planarization layer on top and side surfaces of a plurality of gates on a substrate, wherein the plurality of gates each include a spacer layer thereon, and the organic planarization layer comprises top and side surfaces;

forming a contact area oxide layer on the top and side surfaces of the organic planarization layer, wherein the contact area oxide comprises top and side surfaces;

removing a portion of the contact area oxide layer to expose a top surface of the organic planarization layer;

stripping the entire organic planarization layer to form a cavity over the top and side surfaces of the plurality of gates and between the side surfaces of the contact oxide layer, exposing an entirety of the top and side surfaces of all of the plurality of gates including the spacer layers thereon, on which the organic planarization layer was formed;

patterning a direct lithographically-patternable gap dielectric on at least one of the gates in the cavity; and depositing a conductive contact in a remaining portion of the cavity, wherein the depositing of the conductive contact in the remaining portion of the cavity is performed without any prior removal of the patterned direct lithographically-patternable gap dielectric.

* * * * *